(12) United States Patent  
Hosomi et al.

(10) Patent No.: US 7,368,497 B2
(45) Date of Patent: May 6, 2008

(54) RESIN COMPOSITION, PREPREG, LAMINATE, AND SEMICONDUCTOR PACKAGE

(75) Inventors: Takeshi Hosomi, Tokyo (JP); Masako Yamashita, Joetsu (JP); Takayuki Baba, Tokyo (JP); Kentaro Yabuki, Soja (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 395 days.

(21) Appl. No.: 10/789,914

(22) Filed: Feb. 27, 2004

(65) Prior Publication Data

US 2004/0234741 A1 Nov. 25, 2004

Related U.S. Application Data

(63) Continuation-in-part of application No. PCT/JP02/08845, filed on Aug. 30, 2002.

(51) Int. Cl.
*C08K 3/36* (2006.01)
*B32B 5/16* (2006.01)
*B05B 5/00* (2006.01)

(52) U.S. Cl. .................. 524/492; 428/331; 427/285; 427/287

(58) Field of Classification Search ............... 428/331; 427/285, 287; 524/492
See application file for complete search history.

(56) References Cited

U.S. PATENT DOCUMENTS 4,309,473 A 1/1982 Minamisawa et al.

FOREIGN PATENT DOCUMENTS

| JP | HEI 6-107958 | | 4/1994 |
|---|---|---|---|
| JP | 2002020461 A | * | 1/2002 |
| JP | 2002-105198 | | 4/2002 |
| JP | 2002-114823 | | 4/2002 |
| JP | 2002-114838 | | 4/2002 |
| JP | 2002-117832 | | 4/2002 |
| JP | 2002172736 A | * | 6/2002 |
| JP | 2003206360 A | * | 7/2003 |

OTHER PUBLICATIONS

International Search Report for PCT/JP02/08845 published in WO 03/018675.*
JPO computer generated translations for 2002-020461 and 2002-172736 and 2003-206360.*
Communication from The European Patent Office regarding corresponding EP Application No. 02772828, Dec. 10, 2004.

* cited by examiner

*Primary Examiner*—Kriellion A Sanders
(74) *Attorney, Agent, or Firm*—Harness, Dickey & Pierce, PLC

(57) ABSTRACT

A resin composition which can be used to form a prepreg having sufficient flexibility to prevent cracking from occurring therein is provided. Further, a prepreg having sufficient flexibility to prevent cracking from occurring, a prepreg having excellent workability even in the case where the resin composition in the prepreg is in an uncured state, and a laminate provided with such a prepreg are also provided. The resin composition is used to form a sheet-shaped prepreg by impregnating a base material with the resin composition, and the composition comprises a first thermosetting resin, a second thermosetting resin having a lower weight average molecular weight than that of the first thermosetting resin, a curing agent, and a filler. The prepreg is formed by impregnating a base sheet material with the resin composition described above. The laminate is formed by laminating a metallic foil on the prepreg and then molding them by heating under pressure. A semiconductor package is manufactured by mounting an IC chip on a prepreg on which the metallic foil has been laminated.

17 Claims, 1 Drawing Sheet

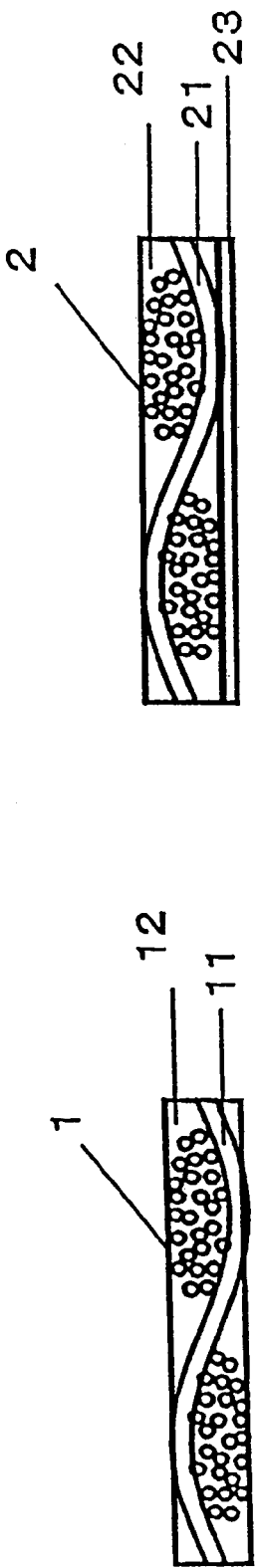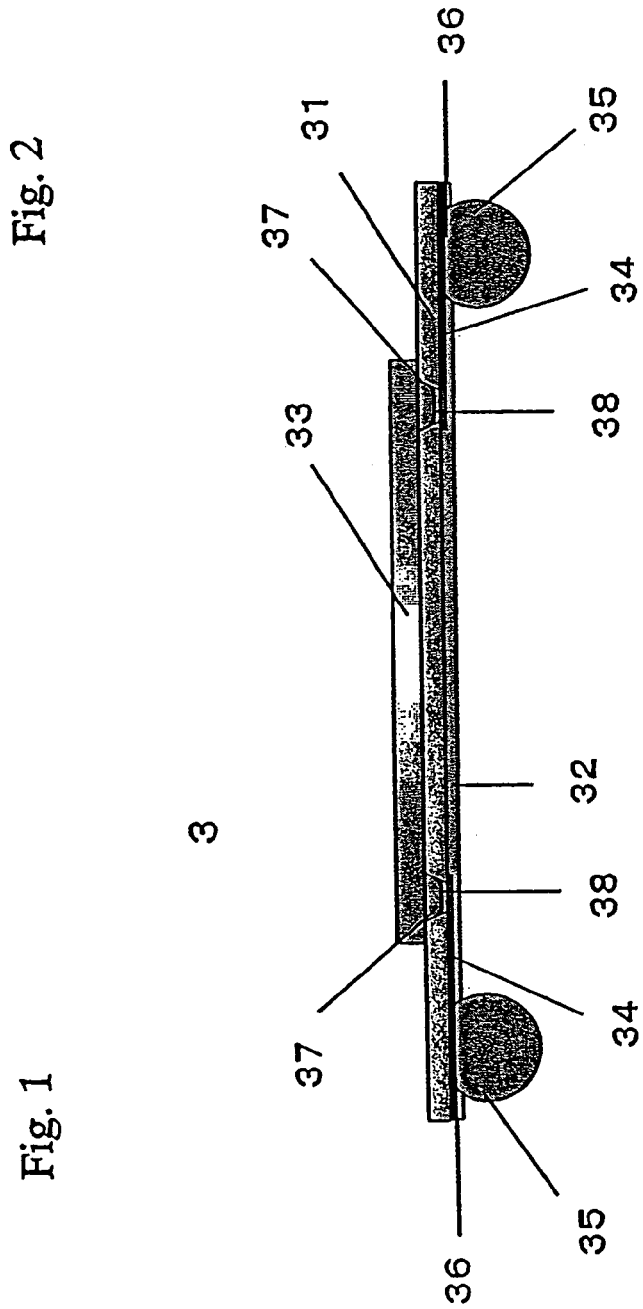

RESIN COMPOSITION, PREPREG, LAMINATE, AND SEMICONDUCTOR PACKAGE

FIELD OF THE INVENTION

This invention relates to a resin composition, a prepreg, a laminate, and a semiconductor package.

BACKGROUND ART

In general, a prepreg used for a printed wiring board is formed by impregnating a base material such as glass cloth or the like with a varnish made of a thermosetting resin such as epoxy resin, cyanate resin or the like and then drying it by heating with being reacted. By using the thus formed prepreg, copper clad laminates, printed wiring boards and the like are manufactured.

When the resin constituting the prepreg is in an uncured state, there is a problem in that the surface of the prepreg becomes tacky (that is, tack is developed) so that workability is lowered. Further, there is also a problem in that excessive resin flow occurs when the prepregs are heated and pressed during laminating so that moldability is lowered.

To address such problems, practically, the thermosetting resin constituting the prepreg is cured to a semi-cured state in the above-mentioned heating and reacting process, to thereby suppress development of tack on the surface of the prepreg and control resin flow when the prepregs are heated and pressed during laminating.

However, a problem exists with such a prepreg in a semi-cured state in that it is susceptible to cracking because of its lack of flexibility. As a result, such a semi-cured state prepreg can not be directly subjected to circuit formation processing.

Another problem also exists with such a semi-cured state prepreg in that dust of the resin and the base material is generated during cutting of the prepreg because of poor adhesive strength between the semi-cured resin and the base material, which also results in a lowered workability. In addition, there is also a problem in that such dust comes off the prepreg in handling the prepreg for manufacturing a laminate, and then it is likely to be attached to a metallic foil such as copper foil as well as to a metallic plate used in lamination molding, so that so-called pits and dents are produced on molded laminates and printed wiring boards.

Consequently, a resin material which can be used to form a prepreg which can be directly subjected to circuit formation processing even in the case where the prepreg is in an uncured state or a semi-cured state has not yet been existed. Further, an idea that an uncured state prepreg or a semi-cured state prepreg is made to undergo circuit formation processing and the like as it is has not been conceived until now.

DISCLOSURE OF THE INVENTION

It is an object of the present invention to provide a resin composition which enables a resultant prepreg to have sufficient flexibility to prevent cracking from occurring therein.

It is another object of the present invention to provide a prepreg having sufficient flexibility to prevent cracking from occurring, and a prepreg having excellent workability even in the case where the resin composition in the prepreg is in an uncured state.

It is yet another object of the present invention to provide a laminate and a semiconductor package which are provided with such a prepreg described above.

In order to achieve the objects stated above, the present invention is directed to a resin composition which is used to form a sheet-shaped prepreg by being impregnated into a base material, wherein the resin composition comprises a first thermosetting resin having a weight average molecular weight, a second thermosetting resin having a lower weight average molecular weight than that of the first thermosetting resin, a curing agent, and a filler.

Further, in the present invention, it is preferred that the resin composition further comprises a resin of which moisture absorption is lower than that of both of the first thermosetting resin and the second thermosetting resin.

In the present invention, it is also preferred that the first and second thermosetting resins include epoxy resin or cyanate resin.

It is also preferred that the weight average molecular weight of the first thermosetting resin is equal to or more than 2,000.

Further, it is also preferred that the weight average molecular weight of the second thermosetting resin is equal to or less than 1,500.

Furthermore, it is also preferred that at least one of the first and second thermosetting resins contains cyanate resin. In this case, the cyanate resin is preferably a novolak type cyanate resin.

Moreover, it is also preferred that at least one of the second thermosetting resin and/or the curing agent is in a liquid state at room temperature.

Moreover, it is also preferred that the filler is an inorganic filler in powder form. In this case, the filler is preferably silica.

Moreover, it is also preferred that the filler is in powder form and that the average particle size of the filler is equal to or less than 2 μm.

Moreover, it is also preferred that the content of the filler is 40 to 80 wt % of the total weight of the resin composition.

Another aspect of the present invention is directed to a prepreg formed by impregnating a base material with the resin composition described above. In this case, the reaction rate of the resin composition in the prepreg is preferably equal to or less than 30%.

Further, it is also preferred that the base material is a spread-out glass fiber base material.

Furthermore, it is also preferred that the base material is a nonwoven fabric made of organic fibers.

Moreover, it is also preferred that a metallic foil is laminated on at least one of the surfaces of the prepreg.

Yet another aspect of the present invention is directed to a laminate formed by laminating a metallic foil on at least one of the surfaces of the prepreg described above and then molding them by heating under pressure.

Still another aspect of the present invention is directed to a semiconductor package manufactured by mounting at least one IC chip on the prepreg described above.

The above and further objects, features, and advantages of the present invention will more fully be apparent from the following detailed description of the embodiments with reference to the accompanying drawings.

BRIEF DESCRIPTION OF THE DRAWINGS

FIG. 1 is a cross sectional view which schematically shows an example of a prepreg according to the present invention;

FIG. 2 is a cross sectional view which schematically shows an example of a prepreg according to the present invention, on which a metallic foil is bonded; and FIG. 3 is a side view which schematically shows an example of a semiconductor package according to the present invention.

BEST MODE FOR CARRYING-OUT OF THE INVENTION

A detailed description will now be made with regard to a resin composition, a prepreg, a laminate, and a semiconductor package according to the present invention.

The resin composition of the present invention is used for forming a sheet-shaped prepreg by being impregnated into a base material. The resin composition of the present invention includes a first thermosetting resin, a second thermosetting resin having a lower weight average molecular weight than that of the first thermosetting resin, a curing agent, and a filler.

The prepreg of the present invention is formed by impregnating a base material with the resin composition described above.

The laminate of the present invention is formed by laminating a metallic foil on at least one of the surfaces of the prepreg described above and then molding them by heating under pressure.

The semiconductor package of the present invention is manufactured by mounting at least one IC chip on the prepreg with the metallic foil.

Hereinbelow, a description will be made with regard to the resin composition of the present invention. The resin composition of the present invention includes a first thermosetting resin and a second thermosetting resin having a lower weight average molecular weight than that of the first thermosetting resin. This makes it possible to impart flexibility to a prepreg. In addition, it is also possible to prevent cracking from occurring in a prepreg. As a result, a prepreg formed using the resin composition of the present invention can have an excellent withstanding property for processing operations during circuit formation processing. Here, the withstanding property for processing operations means properties of prepregs by which cracking due to a pressure between a feed roll and a guide roll will not occur during feeding of materials (prepregs), and cracking due to the spray pressure of an etchant during etching in the circuit formation processing will not occur, for example. Further, when a prepreg has flexibility, it is possible to continuously take up the prepreg.

The weight average molecular weight of the first thermosetting resin (especially, cyanate resin) is not limited to any specific value, but is preferably equal to or more than 2,000, and more preferably 2,200 to 10,000. If the weight average molecular weight of the first thermosetting resin exceeds the above upper limit value, the viscosity of a varnish made of the resin composition is increased, thus resulting in the case that the impregnability of the resin into a base material is lowered. On the other hand, if the weight average molecular weight of the first thermosetting resin is less than the above lower limit value, there is a case that an excessive flow of the resin composition occurs during laminating of prepregs.

When the weight average molecular weight of the first thermosetting resin is within the above range, it is possible to prevent development of tack on the surface of a prepreg even in the case where the resin composition in the prepreg is in an uncured state. Preventing such development of tack makes it possible to improve workability in feeding a prepreg.

The weight average molecular weight of the second thermosetting resin (especially, cyanate resin) is not limited to any specific value, but is preferably equal to or less than 1,500, and more preferably 200 to 1,300. If the weight average molecular weight of the second thermosetting resin exceeds the above upper limit value, there is a case that the effect of suppressing generation of dust from a prepreg is lowered. On the other hand, if the weight average molecular weight of the second thermosetting resin is less than the above lower limit value, there is a case that an excessive flow of the resin composition occurs during the laminating of prepregs.

When the weight average molecular weight of the second thermosetting resin is within the above range, a prepreg can have an improved flexibility. In addition, it is possible to suppress generation of dust from a prepreg. Further, it is also possible to improve dispersibility of a filler (which will be described later) in the resin composition.

In this regard, it is to be noted that the weight average molecular weight of the thermosetting resins can be measured by, for example, gel permeation chromatography using polystyrene as a standard.

The first thermosetting resin (especially, cyanate resin) is not limited to a specific one, but one which is in a solid state at room temperature is preferably used. This makes it possible to prevent development of tack on the surface of a prepreg even in the case where the resin composition in the prepreg is in an uncured state.

The second thermosetting resin (especially, cyanate resin) is not limited to a specific one, but one which is in a liquid state at room temperature is preferably used. This makes it possible to improve the flexibility of a prepreg. In addition, it is also possible to suppress generation of dust from a prepreg.

It is to be noted here that "liquid state" is a state that exhibits flowability or fluidity at room temperature. The viscosity of the second thermosetting resin described above is not limited to any specific value, but is preferably equal to or less than 500 Pa·s, and more preferably 300 to 1 Pa·s. In this regard, it is to be noted that the viscosity is measured using an E type viscometer under the condition that a shear rate is each of 0.5, 1.0, 2.5, and 5.0 rpm at a temperature of 25° C. A value obtained at the lowest rpm in the shear rates at which measurement can be made is practically used as the viscosity mentioned above.

Examples of the first and second thermosetting resins include epoxy resin, phenolic resin, urea resin, melamine resin, silicon resin, polyester resin, cyanate resin, and the like. Among these resins, epoxy resin and/or cyanate resin are preferably used.

Examples of the epoxy resin include: phenol-based epoxy resin such as bisphenol type epoxy resin, phenol novolak type epoxy resin, alkylphenol novolak type epoxy resin, biphenol type epoxy resin, naphthol type epoxy resin, resorcinol type epoxy resin, and the like; and modified epoxy resin having an aliphatic structure, a cycloaliphatic structure, an unsaturated aliphatic structure, or the like as a base structure.

The cyanate resin described above can be obtained, for example, by reacting a halogenated cyanogen compound and phenols. Examples of the cyanate resin include novolak type cyanate resin, bisphenol type cyanate resin, and the like. Preferably, at least one of the first thermosetting resin and the second thermosetting resin contains cyanate resin (especially, novolak type cyanate resin). (In this case, it is preferred that the content of the novolak type cyanate resin is 10 wt % or more of the total weight of the resin composition). This makes it possible to improve the heat resistance (glass transition temperature and thermal decomposition temperature) of a prepreg. Further, it is also possible to decrease the coefficient of thermal expansion of a prepreg (especially, the coefficient of thermal expansion of a prepreg in the thickness direction). When the coefficient of thermal expansion of a prepreg in the thickness direction is decreased, strain induced by stress can be reduced in a multi-layer printed wiring board. Furthermore, it is also possible for a multi-layer printed circuit board to have significantly improved connection reliability of micro interlayer connections.

The first and second thermosetting resins may have different molecular structures from each other, but they preferably have the same molecular structure. By using thermosetting resins having the same molecular structure, it is possible to improve compatibility between cyanate resins having different molecular weights from each other.

As for the first and second thermosetting resins, a novolak type cyanate resin represented by the formula (I) is preferably used, for example.

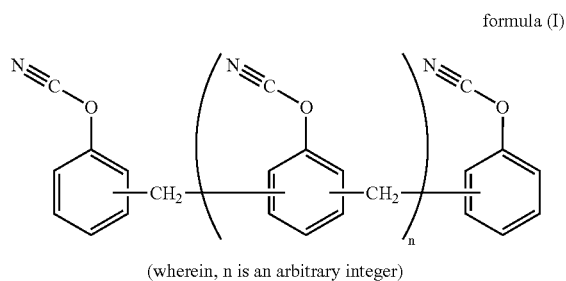

formula (I)

(wherein, n is an arbitrary integer)

When the novolak type cyanate resin represented by the formula (I) is used as a first thermosetting resin, the weight average molecular weight of the resin is not limited to any specific value, but is preferably 2,000 to 10,000, and more preferably 2,200 to 3,500. When the weight average molecular weight of the resin is within the above range, it is possible to effectively prevent development of tack on the surface of a prepreg even in the case where the resin in the prepreg is in an uncured state.

When the novolak type cyanate resin represented by the formula (I) is used as a second thermosetting resin, the weight average molecular weight of the resin is not limited to any specific value, but is preferably 300 to 2,000, and more preferably 500 to 1,500. When the weight average molecular weight of the resin is within the above range, it is possible to further improve the flexibility of a prepreg. In addition, it is also possible to suppress generation of dust from a prepreg. Further, it is also possible to improve dispersibilty of a filler (which will be described later) in the resin composition.

The content of the first thermosetting resin (especially, cyanate resin) is not limited to any specific value, but is preferably 5 to 23 wt % of the total weight of the resin composition, and more preferably 6 to 18 wt %. When the content of the first thermosetting resin is within the above range, it is possible to prevent development of tack on the surface of a prepreg even in the case where the resin in the prepreg is in an uncured state.

The content of the second thermosetting resin (especially, cyanate resin) is not limited to any specific value, but is preferably 2 to 15 wt % of the total weight of the resin composition, and more preferably 4 to 10 wt %. When the content of the second thermosetting resin is within the above range, it is possible to suppress generation of dust from a prepreg as well as to further improve the flexibility of a prepreg.

In the present invention, it is preferred that the resin composition further includes a resin of which moisture absorption is lower than that of both of the first and second thermosetting resins. When the resin composition includes such a resin, the moisture resistance (especially, solder heat resistance after moisture absorption) of a prepreg can be improved.

As for such a resin having low moisture absorption, a resin of which oxygen atom content (especially, oxygen atom in hydroxyl group) is low is preferably used. (Especially, a resin of which oxygen atom content is equal to or less than 5 wt % is preferably used.) Also, a resin which has high crystallinity and high packing degree, and is comprised of molecules containing only C, H, Cl, and F is preferably used. (However, it is preferred that the resin does not contain halogens from the viewpoint of recent trend of environmental protection.) As for such a resin, a resin having a resin structure containing at least one selected from the group including a naphthalene structure, a biphenyl structure, and a cyclopentadiene structure can be mentioned. Specifically, naphthol novolak type epoxy resin and the like can be mentioned.

When a cyanate resin is used as a first thermosetting resin and/or a second thermosetting resin, epoxy resin (especially, aryl-alkyl type epoxy resin) is preferably used as the above-described resin having low moisture absorption, in the light of its reactivity with the cyanate resin. By using epoxy resin as a resin having low moisture absorption, it is possible to improve the moisture resistance of a prepreg. Among the aryl-alkyl type epoxy resins, biphenyl type epoxy resin is especially preferable. By using biphenyl type epoxy resin, it is possible for a prepreg to have excellent heat resistance as well as improved moisture resistance.

When the above-described epoxy resin having low moisture absorption is used as a first thermosetting resin and a second thermosetting resin instead of a cyanate resin, there is no necessity to add another resin having low moisture absorption described above.

The content of the resin having low moisture absorption is preferably equal to or less than 20 wt % of the total weight of the resin composition, and more preferably 10 to 18 wt %. By setting the content to the above range, it is possible to provide a prepreg having an excellent balance of heat resistance, low thermal expansibility, and moisture resistance. In addition, it is also possible to provide a prepreg having flame retardancy without using halogens.

The resin composition of the present invention may further include a curing agent. This makes it possible to control the cross-linking density of the thermosetting resins.

When a cyanate resin is used as the thermosetting resin, examples of the curing agent include: organometallic salt such as zinc naphthenate, cobalt naphthenate, tin octylate, or cobalt octylate; tertiary amines such as triethylamine, tributylamine, or diazabicyclo [2,2,2] octane; imidazoles such as 2-phenyl-4-methylimidazole, 2-ethyl-4-methylimidazole, 2-phenyl-4,5-dihydroxymethylimidazole, or 2-phenyl-4-methyl-5-hydroxymethylimidazole; phenolic compound such as phenol, bisphenol A, or nonyl phenol; phenolic resin; organic acid; and the like. These curing agents may be used alone or in combination. Among them, phenolic resin (especially, phenol novolak resin) is preferably used.

When an epoxy resin is used as the thermosetting resin, examples of the curing agent include: tertiary amines such as triethylamine, tributylamine, or diazabicyclo [2, 2, 2] octane; imidazoles such as 2-phenyl-4-methylimidazole, 2-ethyl-4-methylimidazole, 2-phenyl-4,5-dihydroxymethylimidazole, or 2-phenyl-4-methyl-5-hydroxymethylimidazole; phenolic compound such as phenol, bisphenol A, or nonyl phenol; phenolic resin; organic acid; and the like. These curing agents may be used alone or in combination.

The content of the curing agent is not limited to any specific value, but is preferably 0.01 to 5 wt % of the total weight of the resin composition, and more preferably 0.05 to 3 wt %. When the content of the curing agent is within the above range, it is possible for a prepreg to have excellent moisture resistance and heat resistance.

When the curing agent which also acts on the above-described resin having low moisture absorption contained in the resin composition is used, the functional group equivalent of the curing agent is preferably 50 to 100% of that of the resin having low moisture absorption. In this case, the content of the curing agent and the resin having low moisture absorption is preferably equal to or less than 15 wt % of the total weight of the resin composition. When the content of the curing agent and the resin having low moisture absorption is within the above range, it is possible for a prepreg to have excellent moisture resistance and heat resistance.

The curing agent which also acts on the resin having low moisture absorption as a curing agent therefor is not limited to a specific one, and curing agents which are in a liquid state at room temperature may be used as such a curing agent.

The resin composition of the present invention further includes a filler. This makes it possible to control resin flow during laminating (molding) of uncured state prepregs. By controlling resin flow, it is possible to improve moldability during laminating (molding) of prepregs for forming a laminate.

The filler is not limited to a specific one, but one which is in powder form is preferable, and an inorganic filler in powder form is more preferable. By using such a filler, control of the flowability of the resin composition can be made more suitably. In addition, it is also possible for a prepreg to have lower thermal expansibility.

Examples of the filler include: silicate such as talc, clay, mica, or glass; oxide such as alumina or silica; carbonate such as calcium carbonate or magnesium carbonate; hydroxide such as aluminum hydroxide or magnesium hydroxide; and the like. Among them, oxide such as silica or the like is preferably used. By using such a filler, it is possible for a prepreg to have lower thermal expansibility (especially, it is possible for a prepreg to have a low coefficient of thermal expansion in the thickness direction).

Among silica, fused silica is preferably used. Further, although the shape of silica particle is either sphere or flake, silica comprised of spherical particles is preferably used from the viewpoint of a reduction in the melt viscosity of the resin composition so that the impregnability of the resins into a glass base material is ensured. By using such spherical fused silica, it is possible to increase the filling efficiency of silica into a prepreg, thereby enabling a prepreg to have lower thermal expansibility.

The average particle size of the filler is not limited to any specific value, but is preferably equal to or less than 2 µm, and more preferably 0.2 to 1 µm. By using the filler having the average particle size within the above range, it is possible to impart thixotropy to the resin composition. In addition, it is possible to satisfactorily control the flowability of the resins.

The content of the filler is not limited to any specific value, but is preferably 40 to 80 wt % of the total weight of the resin composition, and more preferably 50 to 70 wt %. By setting the content of the filler to the above range, it is possible to impart thixotropy to the resin composition. When the resin composition has thixotropy, it is possible to control resin flow during press molding of prepregs.

Next, the prepreg of the present invention will be described.

A prepreg 1 of the present invention is a sheet-shaped prepreg formed by impregnating a base material with the resin composition described above. In this way, it is possible to obtain a prepreg having excellent flexibility. Further, it is also possible to obtain a prepreg in which cracking is difficult to occur.

As shown in FIG. 1, the prepreg 1 is constituted from a sheet-shaped base material 11 and a resin composition 12.

Examples of the base material include: glass fiber base material such as glass woven fabric, glass nonwoven fabric, or glass paper; woven fabric and nonwoven fabric which are made of organic fibers such as paper fibers. (pulp), aramid fibers, polyester fibers, or fluoropolymer fibers; woven fabric, nonwoven fabric, and mat which are made of metallic fibers, carbon fibers, or mineral fibers; and the like. These base materials may be used alone or in combination. Among them, nonwoven fabric made of organic fibers is preferably used. By using such a base material, it is possible to improve the processability in forming via holes in the prepreg with laser.

Further, among these glass fiber base materials, one which has been subjected to spread-out processing is preferably used. By using such a glass fiber base material as a base material, it is possible to improve the processability in forming via holes in the prepreg with laser. It is to be noted here that a spread-out glass fiber base material refers to one in which warp yarns and weft yarns are both arranged without substantially any gap.

Examples of a method for impregnating the resin composition into the base material include: immersion of the base material into a resin varnish; coating a resin varnish on the base material using various coaters; spraying a resin varnish to the base material using a spray; or the like. Among these methods, immersion of the base material into a resin varnish is preferably used. By using such a method, it is possible to improve the impregnability of the resin composition into the base material. It is to be noted that a commonly used impregnation and coating machine can be used for immersion of the base material into a resin varnish.

As for a solvent for use in preparing a resin varnish, it is desirable that a solvent which has good solubility to the resin composition is preferably used. However, a poor solvent may be added to the solvent as long as the solvent does not receive any adverse effect. Examples of the solvent which has good solubility to the resin composition include methyl ethyl ketone, cyclohexanone, and the like.

The solid content of the resin varnish is not limited to any specific value, but is preferably 40 to 80 wt %, and more preferably 50 to 70 wt %. By setting the content of the resin varnish to the above range, it is possible to further improve the impregnability of the resin varnish into the base material.

Although the prepreg of the present invention can be used with the resin in the prepreg being cured by heating as is the same manner as the conventional prepreg, the prepreg of the present invention may be used with the resin being in an uncured state. Also, the prepreg of the present invention may be used with the resin being cured to a semi-cured state which is a state between a cured state and an uncured state. Specifically, it is possible to laminate a metallic foil on a prepreg, even in the case where the prepreg is being in an uncured state, and it is also possible to form a circuit on such a prepreg with the metallic foil.

The reaction rate of the resin composition in the prepreg is not limited to any specific value, but is preferably equal to or less than 30%, and more preferably 0.1 to 20%. By setting the reaction rate to the above range, it is possible to prevent dust from being generated as well as to produce the above-described effect. On the other hand, a conventional prepreg has problems in that the reaction rate of a resin composition in the prepreg is about 60 to 80% so that the prepreg lacks in flexibility, and that dust is generated. The prepreg of the present invention can be used with the resin in the prepreg being in an uncured state or a state in which reaction rate is low, because the prepreg has flexibility.

The reaction rate described above can be determined by means of differential scanning calorimetry (DSC). Specifically, the reaction rate can be determined by comparing areas at the exothermic peaks during reaction in DSC between an unreacted resin composition and the resin composition in the prepreg of the present invention, and practically it is determined based on the following formula (I). It is to be noted that measurement by means of DSC is made at a temperature elevation rate of 10° C./min and in an atmosphere of nitrogen.

Reaction rate (%)=(1−area at exothermic peak during reaction of resin composition in prepreg/ area at exothermic peak during reaction of unreacted resin composition)×100    (I)

A sample for use in determining the area at the exothermic peak of the unreacted resin composition is prepared by impregnating a base material with a resin varnish, made of the resin composition of the present invention and a solvent, to obtain a prepreg, air-drying the prepreg at 40° C. for 10 minutes, and then removing the solvent from the prepreg in a vacuum of 1 kPa, at 40° C. for 1 hour.

Next, a description will be made with regard to a prepreg (a prepreg with a metallic foil) obtained by laminating a metallic foil on at least one of the surfaces of the prepreg described above.

As shown in FIG. 2, a prepreg with a metallic foil 2 is constituted from a prepreg which is formed from a sheet-shaped base material 21 and a resin composition 22, and a metallic foil 23, wherein the metallic foil 23 is laminated on one of the surfaces of the prepreg.

The resin composition may be in an uncured state or a semi-cured state. In the case where the resin composition is in a semi-cured state, the reaction rate of the resin composition in the prepreg with the metallic foil is not limited to any specific value, but is preferably equal to or less than 30%, and more preferably 0.1 to 20%. When the reaction rate of the resin composition in the prepreg with the metallic foil lies in the above range, it is possible for the prepreg to be subjected to circuit formation processing. In addition, it is possible to improve the processability in forming via holes in the prepreg with laser.

Examples of a metallic material used for forming a metallic foil include copper or copper based alloy; aluminum or aluminum based alloy; and the like. The thickness of the metallic foil is preferably 3 to 70 µm, and more preferably 12 to 35 µm. The metallic foils may be respectively laminated on both surfaces of the prepreg.

Next, a description will be made with regard to the laminate of the present invention.

The laminate of the present invention is formed by laminating a metallic foil on at least one of the surfaces of the prepreg described above and then molding them by heating under pressure.

When the laminate is formed using one prepreg, a metallic foil or film is laminated on one or both of the surfaces of the prepreg. When the laminate is formed using two or more prepregs, a metallic foil or film is laminated on one or both of the outermost surfaces of the laminated prepregs.

As described above, the laminate of the present invention is formed by heating the prepreg with the laminated metallic foil under pressure. The heating temperature is not limited to any specific value, but is preferably 120 to 220° C., and more preferably 150 to 200° C. The pressure is not also limited to any specific value, but is preferably 2 to 5 MPa, and more preferably 2.5 to 4 MPa.

Next, a description will be made with regard to the semiconductor package of the present invention.

The semiconductor package of the present invention is formed by mounting at least one IC chip on the prepreg with the metallic foil described above.

As shown in FIG. 3, a semiconductor package 3 of the present invention includes a prepreg with a metallic foil 31, on which a circuit is formed, a solder resist layer 32, and an IC chip 33.

The prepreg with a circuit 31 can be obtained by, for example, subjecting the prepreg with the metallic foil 2 shown in FIG. 2 to circuit formation processing (including other processing). A circuit is formed in the prepreg with the metallic foil 2 through the following processes: formation of an etching resist layer on the surface of the metallic foil 23; exposure of a specified circuit pattern; development of the etching resist layer; etching of the metallic foil 23 with the circuit pattern being masked by the etching resist layer; stripping of the etching resist layer (mask); and the like.

The solder resist layer 32 is formed on the side of the prepreg with the circuit 31, where a circuit 34 is provided. The solder resist layer 32 is formed through the processes of exposure of a resist pattern, development of a resist layer, and curing of the resist layer, thereby providing lands 36 on which solder balls 35 are to be provided.

Further, in the prepreg with the circuit 31, via holes 37 are formed by drilling the prepreg from a resin surface side (that is the side where the metallic foil is not laminated) using a laser or the like. In this way, an interposer is obtained. It is to be noted that a gold plate is preferably applied to the lands 36 and the inner surfaces of the via holes 37, respectively, to keep the connection reliability of the circuit exposed through the lands 36 and the via holes 37.

The IC chip 33 is mounted on the resin surface of the prepreg with the circuit 31, which is opposite to the surface on which the solder resist layer 32 is provided. The IC chip 33 is electrically connected to the circuit 34 through bumps 38 in the via holes 37. In this way, the semiconductor package 3 is formed.

Then, on each of the lands 36 of the semiconductor package 3, a solder ball 35 is formed. The semiconductor package 3 is connected to a printed board (not shown) through the solder balls 35.

The prepreg of the present invention has sufficient withstanding property for processing operations during the circuit formation processing as well as each of the subsequent processes after the circuit formation processing as described above. Therefore, in the assembling operations for manufacturing the semiconductor package, problems such as occurrence of cracking in the prepreg, generation of dust, and the like will not occur.

The resin composition used in the prepreg with the metallic foil may be in an uncured state or a semi-cured state. In the case where the resin composition is in a semi-cured state, the reaction rate of the resin composition is preferably equal to or less than 30%, and more preferably 0.1 to 20%. By using the resin having the reaction rate that lies in the above range, it is possible to bond the prepreg with the metallic foil to the IC chip without using an adhesive and to seal the IC chip.

The semiconductor package obtained in a manner described above can be thinned, because cracking is hard to occur in the prepreg of the present invention even in the case where it is made thin. Further, such a thinner semiconductor package is capable of high-speed operation because wiring length is shortened.

EXAMPLE

Hereinbelow, the present invention will be described based on examples and comparative examples. It is understood that the present invention is not limited to the examples.

First, a description will be made with regard to examples of the prepreg (prepreg with a metallic foil) of the present invention.

Example 1

<1> Preparation of Resin Varnish 10 parts by weight of novolak type cyanate resin (manufactured by Lonza Japan, Ltd. with a trade name of PRIMASET and a product code of PT-60, and having a weight average molecular weight of 2,300) as a first thermosetting resin; 10 parts by weight of novolak type cyanate resin (manufactured by Lonza Japan, Ltd. with a trade name of PRIMASET and a product code of PT-30, and having a weight average molecular weight of 1,300) as a second thermosetting resin; 12 parts by weight of biphenyldimethylene type epoxy resin ("NC-3000SH" which is a product of NIPPON KAYAKU Co., Ltd.) as a resin having low moisture absorption; 8 parts by weight of biphenyldimethylene type phenolic resin ("MEH-7851-3H" which is a product of MEIWA PLASTIC INDUSTRIES, LTD.) as a curing agent; and 60 parts by weight of spherical fused silica ("SFP-10X" which is a product of DENKI KAGAKU KOGYO KABUSHIKI KAISHA, and its average particle size is 0.3 μm) as a filler were added to 50 parts by weight of methyl ethyl ketone, and then dissolved at room temperature for 10 minutes under agitation using a high-speed agitator, to thereby obtain a resin varnish.

<2> Preparation of Prepreg

The resin varnish obtained in <1>in the above was impregnated into a glass fiber base material ("WEA-1078S" which is a product of Nitto Boseki Co., Ltd. and its thickness is 90 μm), and the glass fiber base material to which the resin varnish was impregnated was dried in a heating furnace at a temperature of 120° C. for 2 minutes, to thereby obtain a prepreg. It is to be noted that the reaction rate of the resin composition contained in the prepreg was 5%.

<3>Preparation of Prepreg with Metallic Foil

A copper foil ("GTS" which is a product of Furukawa Circuit Foil Co., Ltd., and its thickness is 18 μm) was overlaid on the prepreg obtained in <2> in the above, and then they were molded by heating under pressure at a temperature of 120° C. under a pressure of 2.5 MPa for 15 minutes, to thereby obtain a prepreg with a metallic foil, in which the thickness of the insulating layer was 100 μm. It is to be noted that the reaction rate of the resin composition contained in the prepreg was still 5%.

Example 2

A prepreg with a metallic foil of Example 2 was prepared in the same manner as Example 1 except that the content of the first thermosetting resin, the content of the second thermosetting resin, the content of the resin having low moisture absorption, and the content of the curing agent were changed to 13 parts by weight, 13 parts by weight, 8 parts by weight, and 6 parts by weight, respectively.

Example 3

A prepreg with a metallic foil of Example 3 was prepared in the same manner as Example 1 except that a drying temperature in preparing the prepreg was changed to 160° C. so that the reaction rate of the resin composition contained in the prepreg was 20%.

Example 4

A prepreg with a metallic foil of Example 4 was prepared in the same manner as Example 1 except that a drying temperature in preparing the prepreg was changed to 170° C. so that the reaction rate of the resin composition contained in the prepreg was 30%.

Example 5

A prepreg with a metallic foil of Example 5 was prepared in the same manner as Example 1 except that the first thermosetting resin was changed to PRIMASET PT-60A (having a weight average molecular weight of 6,000) which was obtained by heating PRIMASET PT-60 at 200° C. for 15 minutes.

Example 6

A prepreg with a metallic foil of Example 6 was prepared in the same manner as Example 1 except that the second thermosetting resin was changed to bis E type cyanate resin ("LACY" which is a trade name of a product manufactured by Lonza Japan, Ltd.).

Example 7

A prepreg with a metallic foil of Example 7 was prepared in the same manner as Example 1 except that the content of the first thermosetting resin was changed to 18.5 parts by weight and the content of the second thermosetting resin was changed to 1.5 parts by weight.

Example 8

A prepreg with a metallic foil of Example 8 was prepared in the same manner as Example 1 except that the content of the first thermosetting resin was changed to 5 parts by weight and the content of the second thermosetting resin was changed to 15 parts by weight.

Example 9

A prepreg with a metallic foil of Example 9 was prepared in the same manner as Example 1 except that the resin having low moisture absorption was changed to a norbornene-based resin ("ARTON" which is a trade name of a product manufactured by JSR Corporation).

Example 10

A prepreg with a metallic foil of Example 10 was prepared in the same manner as Example 1 except that the content of the first thermosetting resin, the content of the second thermosetting resin, the content of the resin having low moisture absorption, and the content of the curing agent were changed to 15 parts by weight, 15 parts by weight, 6 parts by weight, and 4 parts by weight, respectively.

Example 11

A prepreg with a metallic foil of Example 11 was prepared in the same manner as Example 1 except that the curing agent was changed to a phenol novolak resin ("PR-51714" which is a product of SUMITOMO BAKELITE Co., Ltd.).

Example 12

A prepreg with a metallic foil of Example 12 was prepared in the same manner as Example 1 except that the filler was changed to silica having an average particle size of 4.4 μm ("FB-5SDX" which is a product of DENKI KAGAKU KOGYO KABUSHIKI KAISHA).

Example 13

A prepreg with a metallic foil of Example 13 was prepared in the same manner as Example 1 except that the filler was changed to alumina ("AO-802" which is a product of Admatechs Co., Ltd., and its average particle size is 0.7 μm).

Example 14

A prepreg with a metallic foil of Example 14 was prepared in the same manner as Example 1 except that the content of the first thermosetting resin, the content of the second thermosetting resin, the content of the resin having low moisture absorption, the content of the curing agent, and the content of the filler were changed to 14 parts by weight, 14 parts by weight, 17 parts by weight, 11 parts by weight, and 44 parts by weight, respectively.

Example 15

A prepreg with a metallic foil of Example 15 was prepared in the same manner as Example 1 except that the base material was changed to an organic nonwoven fabric (aramid) ("APT-72" which is a product of Oji Paper Co., Ltd.).

Example 16

A prepreg with a metallic foil of Example 16 was prepared in the same manner as Example 1 except that the first thermosetting resin was changed to a biphenyldimethylene type epoxy resin ("NC-3000SH" which is a product of NIPPON KAYAKU Co., Ltd.), the content of the first thermosetting resin was changed to 22 parts by weight, the second thermosetting resin was changed to a bisphenol F type epoxy resin ("EP830" which is a product of DAINIPPON INK AND CHEMICALS INCORPORATED), and the content of the second thermosetting resin was changed to 10 parts by weight.

Comparative Example 1

A prepreg with a metallic foil of Comparative Example 1 was prepared in the same manner as Example 1 except that the second thermosetting resin was not used and the content of the first thermosetting resin was changed to 20 parts by weight.

Comparative Example 2

A prepreg with a metallic foil of Comparative Example 2 was prepared in the same manner as Example 1 except that the first thermosetting resin was not used and the content of the second thermosetting resin was changed to 20 parts by weight.

Comparative Example 3

A prepreg with a metallic foil of Comparative Example 3 was prepared in the same manner as Example 1 except that the filler was not used, and that the content of the first thermosetting resin, the content of the second thermosetting resin, the content of the resin having low moisture absorption, and the content of the curing agent were changed to 25 parts by weight, 25 parts by weight, 30 parts by weight, and 20 parts by weight, respectively.

Comparative Example 4

A prepreg with a metallic foil of Comparative Example 4 was prepared in the same manner as Example 1 except that the curing agent was not used, and that the content of the first thermosetting resin, the content of the second thermosetting resin, the content of the resin having low moisture absorption were changed to 10 parts by weight, 10 parts by weight, and 20 parts by weight, respectively.

For each of the prepregs prepared in Examples 1 to 16 and Comparative Examples 1 to 4, evaluation tests were made. Evaluation items and their details are described below. Evaluation results are shown in Table 1 as follows:

TABLE 1

|  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| First resin | PRIMASET PT-60 | 10 | 13 | 10 | 10 |  | 10 | 18.5 | 5 | 10 | 15 |
|  | PRIMASET PT-60A |  |  |  |  | 10 |  |  |  |  |  |
|  | NC-3000SH |  |  |  |  |  |  |  |  |  |  |
| Second resin | PRIMASET PT-30 | 10 | 13 | 10 | 10 | 10 |  | 1.5 | 15 | 10 | 15 |
|  | LACY |  |  |  |  |  | 10 |  |  |  |  |
|  | EP-830 |  |  |  |  |  |  |  |  |  |  |

TABLE 1-continued

|  |  |  |  |  |  |  |  |  |  |  |
|---|---|---|---|---|---|---|---|---|---|---|
| Resin having low moisture absorbency | NC-3000SH | 12 | 8 | 12 | 12 | 12 | 12 | 12 | 12 |  | 6 |
|  | ARTON |  |  |  |  |  |  |  |  | 12 |  |
| Curing agent | MEH-7851-3H | 8 | 6 | 8 | 8 | 8 | 8 | 8 | 8 | 8 | 4 |
|  | PR-51714 |  |  |  |  |  |  |  |  |  |  |
| Filler | SFP-10X | 60 | 60 | 60 | 60 | 60 | 60 | 60 | 60 | 60 | 60 |
|  | FB-5SDX |  |  |  |  |  |  |  |  |  |  |
|  | AO-802 |  |  |  |  |  |  |  |  |  |  |
| Reaction rate (%) |  | 5 | 5 | 20 | 30 | 5 | 5 | 5 | 5 | 5 | 5 |
| Evaluations | Flexibility | A | A | A | A | B | A | B | A | A | A |
|  | Development of tack | A | A | A | A | A | B | A | B | A | A |
|  | Generation of dust | A | A | A | B | A | A | B | A | A | A |
|  | Resin flow (%) | 15 | 20 | 12 | 10 | 10 | 20 | 12 | 18 | 20 | 20 |
|  | Processability with laser | B | B | B | B | B | B | B | B | B | B |

|  |  | Ex. 11 | Ex. 12 | Ex. 13 | Ex. 14 | Ex. 15 | Ex. 16 | Com. 1 | Com. 2 | Com. 3 | Com. 4 |
|---|---|---|---|---|---|---|---|---|---|---|---|
| First resin | PRIMASET PT-60 | 10 | 10 | 10 | 14 | 10 |  | 20 |  | 25 | 10 |
|  | PRIMASET PT-60A |  |  |  |  |  |  |  |  |  |  |
|  | NC-3000SH |  |  |  |  |  | 22 |  |  |  |  |
| Second resin | PRIMASET PT-30 | 10 | 10 | 10 | 14 | 10 |  |  | 20 | 25 | 10 |
|  | LACY |  |  |  |  |  |  |  |  |  |  |
|  | EP-830 |  |  |  |  |  | 10 |  |  |  |  |
| Resin having low moisture absorbency | NC-3000SH | 12 | 12 | 12 | 17 | 12 |  | 12 | 12 | 30 | 20 |
|  | ARTON |  |  |  |  |  |  |  |  |  |  |
| Curing agent | MEH-7851-3H |  | 8 | 8 | 11 | 8 | 8 | 8 | 8 | 20 |  |
|  | PR-51714 | 8 |  |  |  |  |  |  |  |  |  |
| Filler | SFP-10X | 60 |  |  | 44 | 60 | 60 | 60 | 60 |  | 60 |
|  | FB-5SDX |  | 60 |  |  |  |  |  |  |  |  |
|  | AO-802 |  |  | 60 |  |  |  |  |  |  |  |
| Reaction rate (%) |  | 5 | 5 | 5 | 5 | 5 | 5 | 5 | 5 | 5 | 5 |
| Evaluations | Flexibility | A | A | A | A | A | A | D | A | A | A |
|  | Development of tack | A | A | A | B | A | A | A | D | C | A |
|  | Generation of dust | A | A | A | A | A | A | D | A | A | A |
|  | Resin flow (%) | 12 | 5 | 15 | 25 | 15 | 25 | 15 | 15 | 40 | 25 |
|  | Processability with laser | B | B | B | B | A | A | B | B | B | B |

<1> Flexibility

A sample having a size of 150 mm×50 mm was cut out from each of the prepregs having no metallic foils, and it was then wrapped around a circular cylinder having a diameter of 10 mm, and was being held in such a state for 5 seconds. The appearance of each sample was observed by naked eyes, and was evaluated according to the following four criteria.

A: no abnormalities were observed
B: virtually no abnormalities were observed
C: whitening was partially observed but prepreg could be practically used
D: cracking and delamination were observed <2> Development of Tack Development of tack in each of the prepregs with metallic foils was determined by touching it with a bare finger at different temperatures, and evaluation was made according to the following four criteria.

A: tack was not developed at 50° C.
B: tack was not developed at 30° C.
C: tack was developed at 30° C. in a small area of prepreg
D: tack was developed at 30° C. in a large area of prepreg <3> Generation of Dust A sample having a size of 50 mm×50 mm was cut out from each of the prepregs with metallic foils, and was folded, to determine as to whether or not dust was generated at that time by naked eyes, and evaluation was made according to the following four criteria.

A: dust was not generated when prepreg was folded at 30° C. or less
B: dust was not generated when prepreg was folded at 50° C.
C: very small amount of dust was generated when prepreg was folded at 50° C.
D: small amount of dust was generated when prepreg was folded at 50° C.

<4> Resin Flow

A sample of a circular form having an area of 100 cm$^2$ was cut out from each of the prepregs having no metallic foils. Then, 8 sheets of the sample were laminated, and they were pressed at a temperature of 170° C. and at a pressure of 3 MPa for 5 minutes. The amount of the resin composition flown out of the laminated sheets of the prepreg at that time was determined, and the evaluation of resin flow was made relative to the amount of the resin composition contained in the prepreg before pressing.

<5> Processability of Via Holes with Laser

Each of the prepregs with metallic foils was drilled using a $CO_2$ laser to form a hole having a diameter of 100 μm. Then, the cross section of the prepreg was observed using an electron microscope, and the condition of cross section was evaluated according to the following four criteria.

A: delamination and cracking were not observed, and roughness was not also observed in wall surface of via hole
B: delamination and cracking were not observed but roughness was observed in wall surface of via hole, but prepreg could be practically used
C: delamination and cracking were partially observed
D: delamination and cracking were observed As shown in Table 1, each of the prepregs prepared in Examples 1 to 16 had excellent flexibility. Further, each of the prepregs prepared in Examples 1 to 5, 7, 9 to 13, 15, and 16 had especially little tack. Furthermore, no dust was generated from each of the prepregs prepared in Examples 1 to 3, 5, 6, and 8 to 16. Moreover, each of the prepregs prepared in Examples 15 and 16 exhibited excellent processability of via holes with laser.

Next, a detailed description will be made with regard to examples of the laminate of the present invention and comparative examples.

Preparation of Laminate

Examples 1a to 16a

Laminates of Examples 1a to 16a were prepared using the prepregs having no metallic foil, prepared in Examples 1 to 16, respectively. 8 sheets of the prepreg were laminated, and electrodeposited copper foils having a thickness of 18 μm ("GTS" which is a product of Furukawa Circuit Foil Co., Ltd.) were overlaid respectively on both of the outermost surfaces of the laminated prepegs. Then, they were molded by heating at a temperature of 200° C. under a pressure of 2.5 MPa for 90 minutes, to thereby obtain a laminate having a thickness of 0.8 mm. It is to be noted that a temperature during molding was elevated at a rate of 3° C./min from room temperature to 200° C.

Comparative Examples 1a to 4a

Laminates of Comparative Examples 1a to 4a were prepared using the prepregs having no metallic foil, prepared in Comparative Examples 1 to 4, respectively. 8 sheets of the prepreg were laminated, and electrodeposited copper foils having a thickness of 18 μm ("GTS" which is a product of Furukawa Circuit Foil Co., Ltd.) were overlaid respectively on both of the outermost surfaces of the laminated prepegs. Then, they were molded by heating at a temperature of 200° C. under a pressure of 2.5 MPa for 90 minutes, to thereby obtain a laminate having a thickness of 0.8 mm. It is to be noted that a temperature during molding was elevated at a rate of 3° C./min from room temperature to 200° C.

For the laminates prepared in Examples 1a to 16a and Comparative Examples 1a to 4a, evaluation tests were made. Evaluation items and their details are described below. Evaluation results are shown in Table 2 as follows:

<1> Flame Retardancy

Each of the laminates was subjected to etching for stripping the metallic foil (copper foil), to thereby obtain a sample. The thus obtained sample was subjected to a vertical burning test in accordance with UL-94.

<2> Resistance to Moisture and Heat

A sample having a size of 50 mm×50 mm was cut out from each of the laminates, and it was subjected to etching for stripping all the copper foil on the bottom side and half of the copper foil on the upper side, in accordance with JIS 6481, to thereby obtain a test piece. Each of the thus obtained test pieces was subjected to a pressure cooker at 121° C., and then was floated in a solder bath at 260° C. with the copper foil being faced toward downward direction. Then, time until blister is produced was measured.

<3> Coefficient of Thermal Expansion

Each of the laminates was subjected to etching for stripping the copper foil, and a test piece having a size of 2 mm×2 mm was cut out therefrom. The coefficient of thermal expansion of each of the test pieces in the thickness direction (Z direction) thereof was measured using a thermal mechanical analyzer (TMA) at 5° C./min.

As is apparent from Table 2, each of the laminates of the Examples 1a to 16a had excellent flame retardancy, and each of the laminates of Examples 1a to 8a and 9a to 14a was V-0 level in the UL-94 burning test. Further, each of the laminates of Examples 1a to 5a, 7a, 8a, and 9a to 12a had an especially low coefficient of thermal expansion.

Next, a detailed description will be made with regard to examples of the semiconductor package of the present invention and comparative examples.

Manufacture of Semiconductor Package

Examples 1b to 16b

Semiconductor packages of Examples 1b to 16b were manufactured using the prepregs with metallic foils prepared in Examples 1 to 16, respectively. In each example, a dry film resist ("38A212" which is a product of Nichigo-Morton Co., Ltd.) was applied on the prepreg with a metallic foil,

TABLE 2

|  |  | Ex. 1a | Ex. 2a | Ex. 3a | Ex. 4a | Ex. 5a | Ex. 6a | Ex. 7a | Ex. 8a | Ex. 9a | Ex. 10a |
|---|---|---|---|---|---|---|---|---|---|---|---|
| Prepreg |  | Ex. 1 | Ex. 2 | Ex. 3 | Ex. 4 | Ex. 5 | Ex. 6 | Ex. 7 | Ex. 8 | Ex. 9 | Ex. 10 |
| Evaluations | Flammability | V-0 | V-0 | V-0 | V-0 | V-0 | V-0 | V-0 | V-0 | V-1 | V-0 |
|  | Resistance to heat and moisutre (sec) | >120 | >120 | >120 | >120 | >120 | >120 | >120 | >120 | >120 | 30 |
|  | Coefficient of thermal expansion (ppm) | 15 | 13 | 15 | 15 | 15 | 25 | 13 | 16 | 17 | 12 |

|  |  | Ex. 11a | Ex. 12a | Ex. 13a | Ex. 14a | Ex. 15a | Ex. 16a | Com. 1a | Com. 2a | Com. 3a | Com. 4a |
|---|---|---|---|---|---|---|---|---|---|---|---|
| Prepreg |  | Ex. 11 | Ex. 12 | Ex. 13 | Ex. 14 | Ex. 15 | Ex. 16 | Com. 1 | Com. 2 | Com. 3 | Con. 4 |
| Evaluations | Flammability | V-0 | V-0 | V-0 | V-0 | V-1 | V-1 | V-0 | V-0 | V-1 | V-1 |
|  | Resistance to heat and moisutre (sec) | 30 | >120 | >120 | >120 | >120 | >120 | >120 | >120 | >120 | 10 |
|  | Coefficient of thermal expansion (ppm) | 15 | 15 | 20 | 28 | 30 | 30 | 12 | 17 | 40 | 15 | and a specified circuit pattern was exposed, and then developed by the use of a 1.5 wt % aqueous solution of sodium carbonate, to thereby form an etching resist layer. Then, the prepreg with the metallic foil on which the etching resist layer (mask) was formed was subjected to etching for stripping the metallic foil, and then the etching resist layer was also stripped by the use of a 3.0 wt % aqueous solution of sodium hydroxide, to thereby form a specified conductive circuit pattern. Next, a dry film solder resist ("CFP-1122" which is a product of SUMITOMO BAKELITE Co., Ltd.) was applied on the prepreg formed with the circuit pattern so as to cover the conductive circuit pattern, and a specified solder resist pattern is exposed, and then developed by the use of a 1.5 wt % aqueous solution of sodium hydroxide, to thereby form a solder resist layer. Next, via holes were made using a $CO_2$ laser in the resin surface of the prepreg, to thereby obtain an interposer.

On the thus obtained interposer constituted of the prepreg with the circuit pattern, a semiconductor device was mounted in a manner described below. Specifically, a flip chip type semiconductor device having solder bumps was fed with being held by a mount tool to perform alignment between the semiconductor device and the pre-heated prepreg formed with the circuit pattern, and then the semiconductor device was mounted on the interposer. Thereafter, the mounted semiconductor device was bonded to the interposer by thermocompressing bonding at the most suitable temperature and at a pressure of 3 kg/cm² for 10 seconds, and the thus obtained one was then subjected to after-curing at a temperature of 200° C. for 60 minutes, to thereby obtain a semiconductor package.

Comparative Examples 1b to 4b

Semiconductor packages of Comparative Examples 3b and 4b were manufactured using the prepregs with metallic foils prepared in Comparative Examples 3 and 4, respectively. In each comparative example, a dry film resist (manufactured by Nichigo-Morton Co., Ltd. with a product name of 38A212) was applied on the prepreg with a metallic foil, and a specified circuit pattern was exposed, and then developed by the use of a 1.5 wt % aqueous solution of sodium carbonate, to thereby form an etching resist layer. Then, the prepreg with the metallic foil on which the etching resist layer (mask) was formed was subjected to etching for stripping the metallic foil, and then the etching resist layer was also stripped by the use of a 3.0 wt % aqueous solution of sodium hydroxide, to thereby form a specified conductive circuit pattern.

Next, a dry film solder resist (manufactured by SUMITOMO BAKELITE Co., Ltd. with a product name of CFP-1122) was applied on the thus obtained prepreg formed with the circuit pattern so as to cover the conductive circuit pattern, and a specified solder resist pattern is exposed, and then developed by the use of a 1.5 wt % aqueous solution of sodium hydroxide, to thereby form a solder resist layer.

Next, via holes were made using a $CO_2$ laser in the resin surface of the prepreg, to thereby obtain an interposer.

On the thus obtained interposer constituted of the prepreg with the circuit pattern, a semiconductor device was mounted in a manner described below. Specifically, a flip chip type semiconductor device having solder bumps was fed with it being held by a mount tool to perform alignment between the semiconductor device and the pre-heated prepreg formed with the circuit pattern, and then the semiconductor device was mounted on the interposer. Thereafter, the mounted semiconductor device was bonded to the interposer by thermocompressing bonding at the most suitable temperature and at a pressure of 3 kg/cm² for 10 seconds, and the thus obtained one was then subjected to after-curing at a temperature of 200° C. for 60 minutes, to thereby obtain a semiconductor package.

It is to be noted that since development of tack and generation of dust were observed in the prepregs prepared in Comparative Examples 1 and 2, no semiconductor packages were manufactured from the prepregs of Comparative Examples 1 and 2.

For each of the semiconductor packages manufactured in the Examples 1b to 16b and Comparative Examples 3b and 4b, evaluation tests were made. Evaluation items and their details are described below. Evaluation results are shown in Table 3 as follows:

TABLE 3

|  |  | Ex. 1b | Ex. 2b | Ex. 3b | Ex. 4b | Ex. 5b | Ex. 6b | Ex. 7b | Ex. 8b | Ex. 9b | Ex. 10b |
|---|---|---|---|---|---|---|---|---|---|---|---|
| Prepreg with metallic foil |  | Ex. 1 | Ex. 2 | Ex. 3 | Ex. 4 | Ex. 5 | Ex. 6 | Ex. 7 | Ex. 8 | Ex. 9 | Ex. 10 |
| Evaluations | Thermal cycling test | 0/10 | 0/10 | 0/10 | 0/10 | 0/10 | 0/10 | 0/10 | 0/10 | 0/10 | 0/10 |
|  | Insulation resistance after humidification | 0/10 | 0/10 | 0/10 | 0/10 | 0/10 | 0/10 | 0/10 | 0/10 | 0/10 | 0/10 |

|  |  | Ex. 11b | Ex. 12b | Ex. 13b | Ex. 14b | Ex. 15b | Ex. 16b | Com. 1b* | Com. 2b* | Com. 3b | Com. 4b |
|---|---|---|---|---|---|---|---|---|---|---|---|
| Prepreg with |  | Ex. 11 | Ex. 12 | Ex. 13 | Ex. 14 | Ex. 15 | Ex. 16 | Com. 1 | Com. 2 | Com. 3 | Com. 4 |
| Evaluations | Thermal cycling test | 0/10 | 0/10 | 0/10 | 0/10 | 0/10 | 0/10 | — | — | 10/10 | 0/10 |
|  | Insulation resistance after humidification | 0/10 | 0/10 | 0/10 | 0/10 | 0/10 | 0/10 | — | — | 0/10 | 5/10 |

*no semiconductor packages were manufactured since development of tack and generation of dust were observed in the prepregs prepared in Comparative Exasmple 1 and 2

<1> Thermal Cycling Test

After the initial continuity was confirmed in each of the semiconductor packages, the semiconductor package was subjected to thermal cycling test for 1,000 cycles in the temperature range from −40° C. to 125° C. with a dwell time of 30 minutes at each extreme temperature (1 hour/cycle). In this test, 10 samples were tested for each of the semiconductor packages, and measurement was made to know the number of the samples containing a broken wire after 1,000 cycles.

<2> Insulation Resistance in Humid Condition

After the initial insulation resistance of each of the semiconductor packages was measured, a direct voltage of 5.5 V was applied to the semiconductor package in an atmosphere at 85° C./85% RH for 1,000 hours. The insulation resistance of the semiconductor package after 1,000 hours have passed was measured. Then, the initial insulation resistance and the insulation resistance after humidification were measured on the condition that a voltage of 100 V was being applied for 1 minute. It is to be noted that the insulation resistance was measured using a comb-type electrode (50 μm lines/50 μm space).

As is apparent from Table 3, all the tested samples of the semiconductor packages of Examples 1b to 16b exhibited excellent results in the thermal cycling test and the insulation resistance test, and thereby it was confirmed that they have excellent connection reliability.

Further, the thickness of each of the semiconductor packages obtained in Examples 1b to 16b was thinner than the thickness of a conventional semiconductor package by 120 μM.

Furthermore, the semiconductor packages obtained in Examples 1b to 16b can be thinned, because cracking is hard to occur in the prepreg of the present invention even in the case where it is made thin. Further, since in such a thinner semiconductor package, wiring length can be shortened, high-speed operation can be achieved.

INDUSTRIAL APPLICABILITY

According to the present invention, it is possible to provide a resin composition which enables a resultant prepreg to be free from tack and have excellent flexibility.

Further, when the resin composition contains a cyanate resin having a specific molecular weight, it is possible to prevent dust from being generated from a resultant prepreg in addition to the effects described above.

Furthermore, when the resin composition contains a specific cyanate resin, it is possible for a resultant prepreg to have a reduced coefficient of thermal expansion in addition to the effects described above.

According to the present invention, it is possible to provide a prepreg having excellent flexibility and chemical resistance, and it is also possible to provide a prepreg having excellent workability even in the case where the resin composition in the prepreg is in an uncured state.

Further, it is also possible to provide a prepreg with a metallic foil to which circuit formation processing can be carried out even in the case where the resin composition is in an uncured state or a semi-cured state.

Furthermore, it is also possible to provide a semiconductor package constituted of an interposer in which an IC chip is bonded without an adhesive to seal it.

What is claimed is:

1. A resin composition which is used to form a sheet-shaped prepreg by being impregnated into a base material, the resin composition comprising:
    a first cyanate resin having a weight average molecular weight;
    a second cyanate resin having a lower weight average molecular weight than that of the first cyanate resin;
    an aryl-alkyl type epoxy resin of which moisture absorption is lower than that of both of the first cyanate resin and the second cyanate resin;
    a curing agent; and
    a filler.

2. The resin composition as claimed in claim 1, wherein the weight average molecular weight of the first cyanate resin is equal to or more than 2,000.

3. The resin composition as claimed in claim 1, wherein the weight average molecular weight of the second cyanate resin is equal to or less than 1,500.

4. The resin composition as claimed in claim 1, wherein at least one of the first and second cyanate resins is a novolak-type cyanate resin.

5. The resin composition as claimed in claim 1, wherein at least one of the second cyanate resin and the curing agent is in a liquid state at room temperature.

6. The resin composition as claimed in claim 1, wherein the filler is an inorganic filler in powder form.

7. The resin composition as claimed in claim 1, wherein the filler is silica.

8. The resin composition as claimed in claim 1, wherein the filler is in powder form and the average particle size of the filler is equal to or less than 2 μm.

9. The resin composition as claimed in claim 1, wherein the content of the filler is 40 to 80 wt % of the total weight of the resin composition.

10. A prepreg formed by impregnating a base material with the resin composition claimed in claim 1.

11. The prepreg as claimed in claim 10, wherein the reaction rate of the resin composition in the prepreg is equal to or less than 30%.

12. The prepreg as claimed in claim 10, wherein the base material is a spread-out glass fiber base material.

13. The prepreg as claimed in claim 10, wherein the base material is a nonwoven fabric made of organic fibers.

14. A laminate formed by laminating a metallic foil on at least one of the surfaces of the prepreg as claimed in claim 10.

15. A laminate formed by laminating a metallic foil on at least one of the surfaces of the prepreg claimed in claim 10 and molding them by heating under pressure.

16. A semiconductor package manufactured by mounting at least one IC chip on the laminate claimed in claim 14.

17. The resin composition as claimed in claim 1 wherein the arly-alkyl type epoxy resin is a biphenyldimethylene type epoxy resin.

\* \* \* \* \*